United States Patent [19]
Liu et al.

[11] Patent Number: 5,712,173
[45] Date of Patent: Jan. 27, 1998

[54] METHOD OF MAKING SEMICONDUCTOR DEVICE WITH SELF-ALIGNED INSULATOR

[75] Inventors: Yowjuang W. Liu, San Jose; Feng Qian, Campbell; Tze-Kwai Kelvin Lai, San Jose, all of Calif.

[73] Assignee: Advanced Micro Devices, Inc., Sunnyvale, Calif.

[21] Appl. No.: 590,981

[22] Filed: Jan. 24, 1996

[51] Int. Cl.⁶ .......................... H01L 21/84; H01L 21/265
[52] U.S. Cl. ........................... 437/24; 437/34; 437/41
[58] Field of Search ........................ 437/24, 41, 34, 437/57, 60, 918

[56] References Cited

U.S. PATENT DOCUMENTS

| 4,523,213 | 6/1985 | Konaka et al. | |
|---|---|---|---|
| 4,683,637 | 8/1987 | Varker et al. | 437/63 |
| 4,700,454 | 10/1987 | Baerg et al. | 437/24 |
| 4,706,278 | 11/1987 | Havemann | 437/24 |
| 5,134,088 | 7/1992 | Zetterlund | 437/60 |
| 5,346,841 | 9/1994 | Yajima | |
| 5,399,507 | 3/1995 | Sun | 437/24 |
| 5,439,841 | 8/1995 | Alter | 437/60 |
| 5,567,629 | 10/1996 | Kubo | 437/24 |

FOREIGN PATENT DOCUMENTS

| 3726842 | 2/1988 | Germany. | |
|---|---|---|---|
| 3726842A1 | 2/1988 | Germany | 437/24 |
| 56-094670 | 7/1981 | Japan. | |
| 3-173171 | 7/1991 | Japan. | |
| 2182489 | 5/1987 | United Kingdom. | |

OTHER PUBLICATIONS

IBM Technical Disclosure Bulletin, "Quasi-Semiconductor-on-Insulator CMOS Structure," vol. 31, No. 8, Jan. 1989, pp. 114–114.

*Primary Examiner*—John Niebling
*Assistant Examiner*—Richard A. Booth
*Attorney, Agent, or Firm*—Lowe, Price, LeBlanc & Becker

[57] ABSTRACT

A semiconductor device having the advantages of an SOI structure without the attendant disadvantages is obtained by implanting oxygen ions using the gate electrode as a mask, and heating to form thin, self-aligned buried oxide regions extending from a field oxide region under source/drain regions self-aligned with the side surfaces of the gate electrode. In other embodiments, the thin buried oxide layer extends from a point in close proximity to the field oxide region and/or partially under the gate electrode.

8 Claims, 5 Drawing Sheets

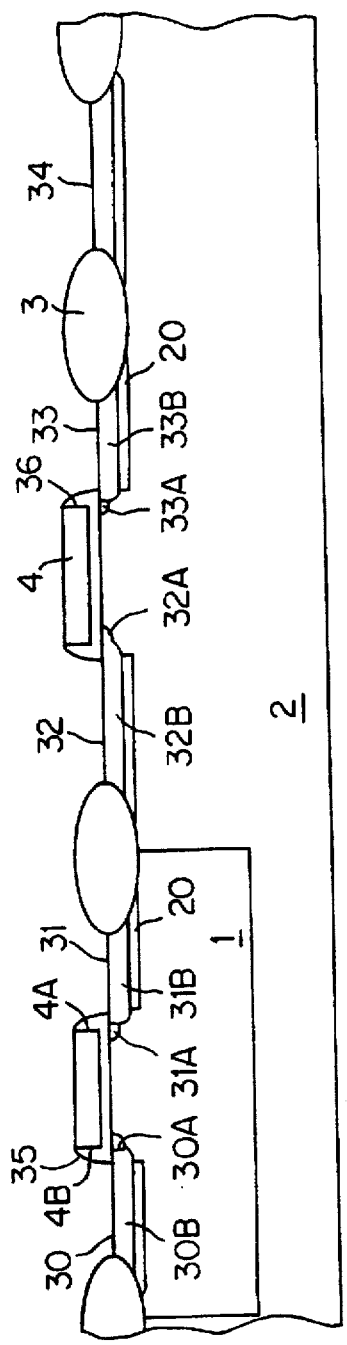
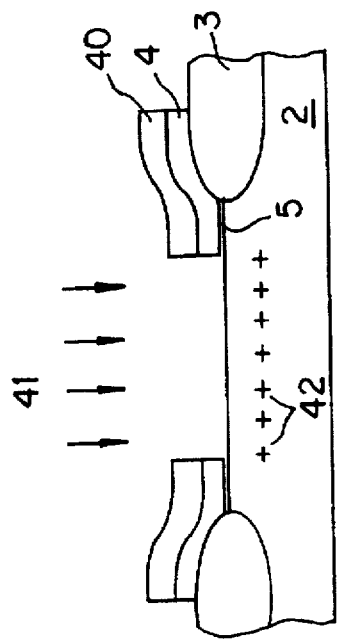
Figure 3
Figure 4

METHOD OF MAKING SEMICONDUCTOR DEVICE WITH SELF-ALIGNED INSULATOR

TECHNICAL FIELD

The present invention relates to a semiconductor device comprising an isolation structure, and to a method of manufacturing the semiconductor device. The invention has particular applicability in semiconductor devices having submicron technology and/or designed for high voltage technology.

BACKGROUND ART

The escalating requirements for increased densification and performance in ultra-large scale integration semiconductor wiring require responsive changes in various aspects of semiconductor manufacturing. Conventional practices employed in the manufacture of semiconductor devices, such as bulk silicon CMOS devices, confront various fundamental performance and reliability limitations, particularly in scaling down the size of devices. These limitations include high junction capacitance, ineffective isolation and latch-up sensitivity. High junction capacitance is primarily attributed to high doping levels required to prevent transistor punch-through and parasitic leakage or field turn on. Scale down LOCOS techniques reduces the effective spacings separating adjacent active regions in a semiconductor substrate and, thereby, increases transistor cross-talk and/or latch-up problems. In order to overcome these problems, conventional practices involve the use of larger than minimum isolation spacings and areas, which is inconsistent with the requirements for high densification. Other conventional approaches comprise the use of inefficient guard ring/bar structures which also increases the die size. An increase in die size requires longer interconnects and, hence, results in products with reduced integrated circuit speeds, i.e., greater resistance capacitance (RC) delays.

A conventional alternative design to avoid the disadvantages of the LOCOS techniques, or modified LOCOS techniques, comprises trench isolation. Advantages of trench isolation include improved latch up and field turn on. However, trench isolation is attendant upon various problems, such as I–V kinks, sidewall leakages, low gate oxide breakdowns, and require significantly more complicated manufacturing steps. In order to overcome trench induced sidewall leakages, higher doping is normally introduced along trench sidewalls. Such high doping increases the junction capacitance. The disadvantageous unreliability and performance attributed to the gate oxide and junction capacitance, respectively, render trench isolation unsatisfactory for high volume production.

Another conventional approach is known as silicon-on-insulator (SOI) structures, wherein, a buried oxide region is provided under the surface semiconductor substrate in the active region. SOI structures advantageously provide lower junction capacitance, improved isolation and improved latch up. However, SOI structures suffer from various problems, such as a high number of defects, I–V kinks due to lattice heating, high source/drain resistance and random threshold voltage behavior.

Thus, there exists a need for a semiconductor device having an improved isolation structure. There is further a need for a method of forming an improved isolation structure which is simplified, efficient, cost-effective, and which can be integrated in conventional MOSFET processing. Thus, there exists a need to provide an isolation structure which can be integrated into conventional MOS structures and offer the selective advantages of both the bulk CMOS structure and the SOI structure without their attendant disadvantages. The resulting semiconductor device having such an improved isolation structure would exhibit higher operating speeds, and improved signal-to-noise ratio, linearity, efficiency and wear resistance.

DISCLOSURE OF THE INVENTION

An object of the present invention is a semiconductor device having an improved isolation structure with reduced junction capacitance, higher operating speeds and an improved signal-to-noise ratio.

Another object of the present invention is a method of manufacturing a semiconductor device having reduced junction capacitance, higher operating speeds and an improved signal-to-noise ratio.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a semiconductor substrate; an active region formed in the semiconductor substrate; a field oxide region adjoining the active region; and a thin buried oxide layer having an upper surface extending from the field oxide region partially under the active region.

Another aspect of the present invention is a semiconductor device comprising: a semiconductor substrate; an active region formed in the semiconductor substrate comprising source/drain regions separated by a channel region, and a gate electrode above the channel region with a gate oxide therebetween; a field oxide region adjoining the active region; and a thin buried oxide layer having an upper surface extending from the field oxide region under a source/drain region up to and substantially aligned with the gate electrode.

A further aspect of the present invention is a semiconductor device comprising: a field oxide region isolating two active regions; and a thin buried oxide layer having an upper surface extending from the field oxide region partially under each active region.

Another aspect of the invention is a semiconductor device comprising: a semiconductor substrate; an active region formed in the semiconductor substrate; a field oxide region adjoining the active region; and a thin buried oxide layer having an upper surface extending from a point proximate the field oxide region partially under the active region.

A further aspect of the invention is a semiconductor device comprising: a semiconductor substrate; a field oxide region isolating two active regions; and a thin buried oxide layer having an upper surface extending from a point proximate the field oxide region partially under each active region.

Another aspect of the invention is a method of manufacturing a semiconductor device, which method comprises: forming a field oxide region in a section of an upper surface of a semiconductor device to isolate an active region; forming a gate electrode having side surfaces over the active region with a gate oxide therebetween; forming a mask on the gate electrode; implanting oxygen ions into the exposed portions of the active region in the semiconductor substrate; and heating to effect reaction of the implanted oxygen ions to form a thin, self-aligned, buried oxide layer with an upper surface extending from the field oxide region within the semiconductor substrate up to and substantially aligned with the gate electrode. A further aspect of the invention is a method of manufacturing a semiconductor device having a self-aligned insulator, which method comprises: forming a field oxide region in a section of an upper surface of a semiconductor device isolating two active regions; implanting oxygen ions through a mask into the exposed portions of the active regions in the semiconductor substrate; and heating to effect reaction of the implanted oxygen ions to form two thin, self-aligned, buried oxide layers with an upper surface extending from the field oxide region partially under each active region.

Another aspect of the present invention is a method of manufacturing a semiconductor device having a self-aligned insulator, which method comprises: forming a field oxide region in a section of an upper surface of a semiconductor device to isolate an active region; forming a gate electrode having side surfaces over the active region with a gate oxide therebetween; forming a mask on the gate electrode; implanting oxygen ions into the exposed portions of the active region in the semiconductor substrate; and heating to effect reaction of the implanted oxygen ions to form a thin, self-aligned, buried oxide layer with an upper surface extending from a point proximate the field oxide region within the semiconductor substrate up to and substantially aligned with the gate electrode.

A further aspect of the present invention is a method of manufacturing a semiconductor device having a self-aligned insulator, which method comprises: forming a field oxide region in a section of an upper surface of a semiconductor device to isolate an active region; forming a gate electrode having side surfaces over the active region with a gate oxide therebetween; forming a mask on the gate electrode; implanting oxygen ions into the exposed portions of the active region in the semiconductor substrate; and heating to effect reaction of the implanted oxygen ions to form a thin, self-aligned, buried oxide layer with an upper surface extending partially under the gate electrode.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIGS. 1 through 3 schematically depict sequential stages of a method of manufacturing a semiconductor device in accordance with the present invention.

FIG. 4 schematically depicts another embodiment of the present invention.

DESCRIPTION OF THE INVENTION

Figure 1:
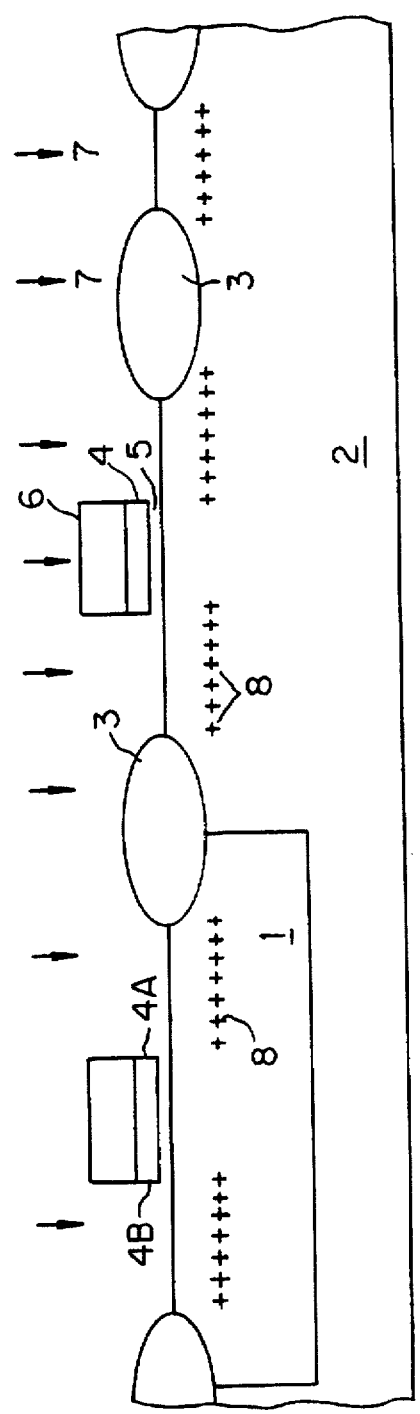

In accordance with the present invention, a semiconductor device is provided having an isolation structure which combines the advantageous aspects of both the field oxide region isolation structure and the SOI structure without their respective attendant disadvantages. The SOI structure was designed to provide lower junction capacitance, better isolation and improved latch up. However, the problems of SOI structures include a greater number of defects, I–V kinks due to lattice heating, high source/drain resistance, and random threshold voltage behavior. Thus, SOI structures exhibit degraded punch through due to the floating substrate, and require complex processing. The present invention provides an improved semiconductor device having the advantages of the SOI structure without its disadvantages.

In accordance with the present invention, an improved semiconductor device is provided with a new isolation type of structure offering the advantages of SOI and trench isolation without their drawbacks. The present invention comprises a method of manufacturing a semiconductor device with an improved isolation structure, which does not require complex equipment or processing steps and, is cost-effective, efficient and fully compatible with existing bulk CMOS processing. In accordance with the present invention, an improved isolation structure is provided subsequent to formation of a conventional field oxide region, by forming a thin buried self-aligned oxide layer with an upper surface extending from the field oxide region under a source region and/or drain region, up to and substantially self-aligned with the gate electrode. Such thin buried oxide insulators are self-aligned with respect to the gate and active regions and, thereby, shield junctions from the substrate. However, such thin self-aligned isolation layers do not extend completely under the active region, thereby providing access to the substrate. Thus, the thin, self-aligned buried oxide layers formed in accordance with the present invention completely eliminate junction capacitance while avoiding the disadvantages of conventional SOI structures, such as punch through, I–V kinks, self-heating, high source/drain resistance, and simplifies processing to a great extent. The thin buried oxide layers of the present invention also allow minimal features to be used for isolation, even less than the limits of photolithography, thereby enabling a significant reduction in die size.

In accordance with the present invention, thin, self-aligned buried oxide layers are formed by providing a mask over the gate electrodes and implanting oxygen ions into the exposed portions of the semiconductor substrate using the gate mask and the gate electrode as a mask. The gate mask is removed and annealing is conducted in a temperature range for a period of time to effect reaction of the implanted oxygen ions with the substrate, typically a silicon substrate. The resulting thin, self-aligned buried oxide layers, preferably between about 10 Å and about 1000 Å, extend from field oxide region within the semiconductor substrate up to and substantially aligned with the gate electrode. During heating to effect reaction of the oxygen ions with the silicon of the semiconductor substrate, some minor extension of the oxide layer may occur under the gate electrode; however, the buried oxide layer is substantially aligned with the gate electrode. Subsequently, conventional processing is conducted to form source/drain regions, each preferably comprising lightly and heavily doped regions. The thin, buried self-aligned oxide layers of the present invention can be formed under either a source region or under a drain region, or under both the source region and the drain region.

Thus, in accordance with the present invention, a CMOS semiconductor device can be formed comprising an N-channel MOSFET and a P-channel MOSFET. Each MOS transistor is formed in an active region of the semiconductor substrate isolated by a field oxide region. In addition, in accordance with the present invention, thin, buried self-aligned oxide layers are formed extending from the field oxide region under the source and/or drain regions up to and substantially aligned with the gate electrode.

In another embodiment of the present invention, angled implantation can be employed so that the thin buried oxide layer extends partially under the gate electrode. In this embodiment, the extent to which the thin buried oxide layer extends under the gate electrode can be optimized to reduce hot carrier injection, junction capacitance and latch up, and to improve isolation.

A method of forming a semiconductor device in accordance with the present invention comprises initially forming a field oxide region in a conventional manner to isolate active regions in a semiconductor substrate in which devices, such as transistors, are subsequently formed. In forming a CMOS semiconductor device comprising an N-channel and a P-channel CMOS transistor, and an N-well 1 is formed in P-substrate 2 as shown in FIG. 1. Active regions are then isolated by field oxide regions 3 formed in a conventional manner. A gate electrode 4 is formed over the active regions with a gate oxide 5 therebetween. Each gate oxide has side surfaces 4A and 4B. A gate mask 6, comprising a conventional photomask material, is formed on the gate electrode to provide shielding. In accordance with the present invention, oxygen ion implantation is conducted, as shown by arrows 7, to implant oxygen ions 8, under the exposed portions of semiconductor substrate 2 which are not under the gate mask and gate electrode or shielded by the field oxide region 3.

Figure 2:
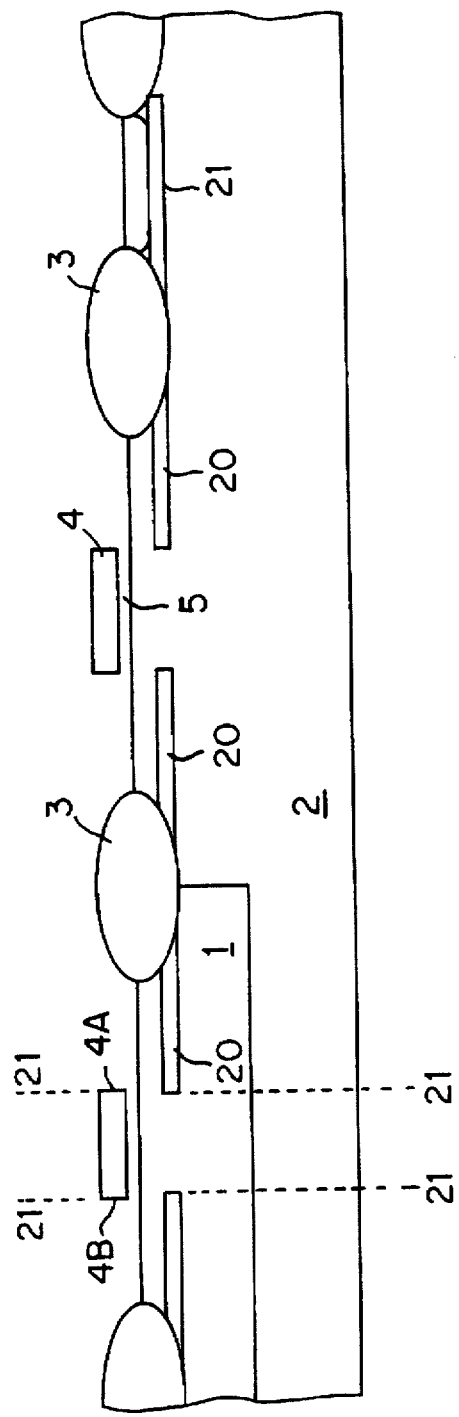

Subsequent processing is shown in FIGS. 2 through 5 wherein elements similar to those depicted in FIG. 1 bear similar reference numerals. As shown in FIG. 2, after implanting oxygen ions, gate mask 6 is removed and annealing is conducted and an elevated temperature for a period of time to effect reaction of the implanted oxygen ions with the semiconductor substrate, typically formed of a monocrystalline silicon. Elevated temperature annealing causes reaction of the implanted oxygen ions with the silicon substrate to form a thin, buried self-aligned silicon oxide layer 20 with an upper surface extending from the field oxide region 3 under the semiconductor substrate up to and substantially aligned with the gate electrode 4, as shown in by dotted lines 20. A thin, buried oxide region 21 can also be formed in an N+ resistor region of the semiconductor substrate. Thus, the semiconductor device depicted in FIG. 2 comprises a field oxide region 3 isolating two active regions and a thin buried oxide layer 20 extending from the field oxide region partially under each active region. Preferably, each thin buried oxide layer has a thickness of about 10 to about 1000 Å.

In the depicted embodiments herein, including FIG. 2, the thin buried oxide layer is shown extending from the field oxide region, i.e., in contact with the field oxide region, as is the preferred embodiment. However, the benefits of this invention are also obtained in situations wherein the thin buried oxide layer does not actually contact the field oxide region but is in proximity thereto. Thus, in accordance with another embodiment of the present invention, the thin buried oxide layer can extend from a point spaced apart from the field oxide region by a short distance, preferably less than about one micron, into an active region. This embodiment can be implemented by appropriate masking, and may also occur by incomplete extension of the thin buried oxide layer upon heating.

The $V_t$ and punch through implants are preferably performed after the oxygen implant and annealing steps. As shown in FIG. 3, subsequent to formation of thin, buried self-aligned oxide layers 20, conventional procedures are conducted comprising implanting impurity ions to form P-type source/drain regions 30, 31 for a P-channel MOS transistor and N-type source/drain regions 32, 33 for an N-channel MOS transistor, as well as N+ region 34. Preferably, in accordance with conventional practices, region 30 contains a lightly doped region (LDD) 30A and a heavily doped region (HDD) 30B, while region 31 contains LDD region 31A and HDD region 31B. Part of the LDD implant can optionally take place prior to oxygen implantation.

Similarly, in the N-channel CMOS transistor, region 32 contains LDD region 32A and HDD region 32B, while region 33 contains LDD region 33A and HDD region 33B. In addition, sidewall spacers 35 and 36 are formed and subsequent processing conducted in a conventional manner. Thus, the present invention involving the selective formation of thin, buried self-aligned oxide layers extending under source/drain regions can be easily integrated into conventional CMOS processing in a cost-effective, efficient manner.

Figure 5:
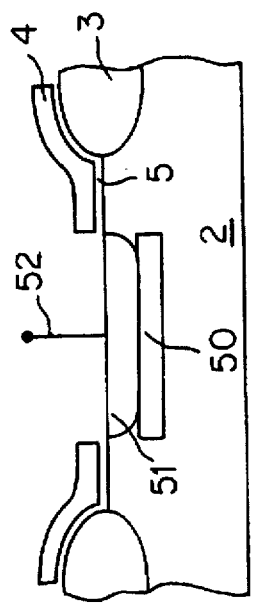
FIG. 5 schematically depicts an embodiment of the present invention.

FIGS. 4 and 5 schematically illustrate the formation of a contact electrically connected to an N-well or a substrate. As shown in FIG. 4, a portion of semiconductor substrate 2 is exposed employing gate electrode 4 with gate mask 40 provided thereon. Oxygen ion implantation is conducted as shown by arrows 41 to implant oxygen ions 42 into the semiconductor substrate. Subsequently, as shown in FIG. 5, the gate mask is removed and heating is conducted to convert the implanted oxygen ions 42 into a thin buried oxide layer 50 under the intended contact area. A P+ region 51 is then formed in the substrate so that thin buried self-aligned oxide region 50 extends thereunder. Contact 52 is then formed electrically connecting the substrate.

Figure 6:
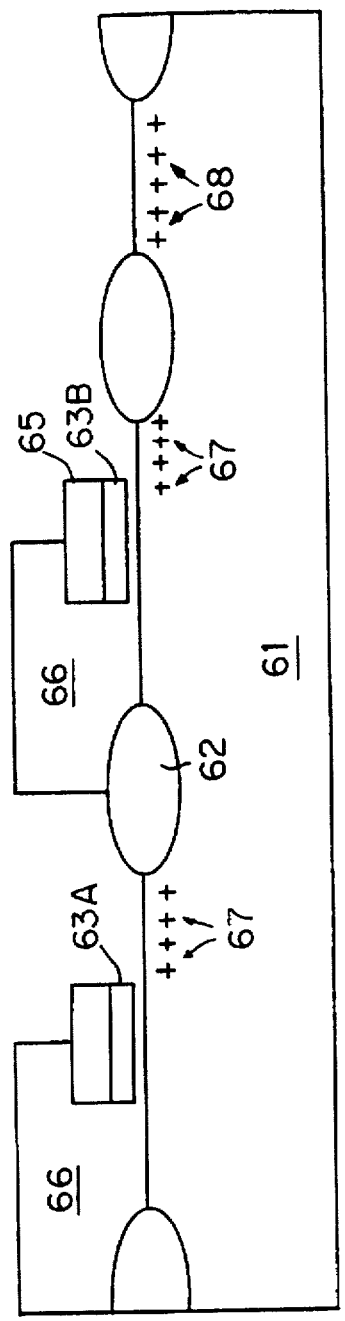
FIGS. 6 through 8 schematically show sequential stages of another embodiment of the present invention.

In another embodiment of the present invention, a thin, buried self-aligned oxide layer is formed to extend only under a source region or only a drain region. This embodiment is implemented by providing a resist mask 66 during ion implantation, as shown in FIG. 6, to selectively implant oxygen ions 68 under an intended drain region. In FIGS. 6 through 10, similar elements bear similar reference numerals. As shown in FIG. 6, N-well 60 is formed in P semiconductor substrate 61 with active regions isolated by field oxide regions 62. Gate electrodes 63 are formed above active regions having side surfaces 63A and 63B. Gate electrodes 63 are separated from the semiconductor substrate by gate oxide 64. A gate mask 65 is formed on gate 63 for shielding the gate electrode during oxygen ion implantation. In this embodiment, a thin self-aligned oxide layer is formed under the drain regions only. Accordingly, resist mask 66 is provided to shield regions under intended source regions. Oxygen ion implantation is then conducted to implant oxygen ions 67 under intended drain regions as well as oxygen ions 68 under intended N+ resistor region.

Figure 7:
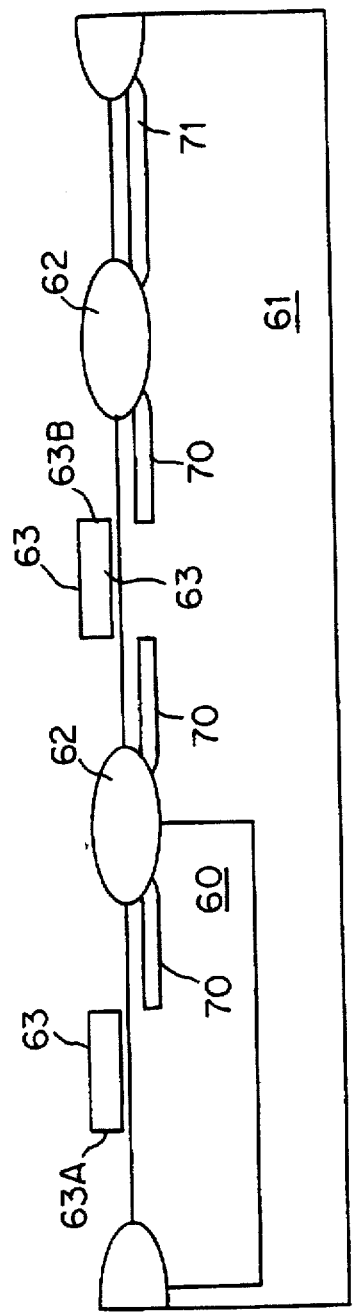
Figure 8:
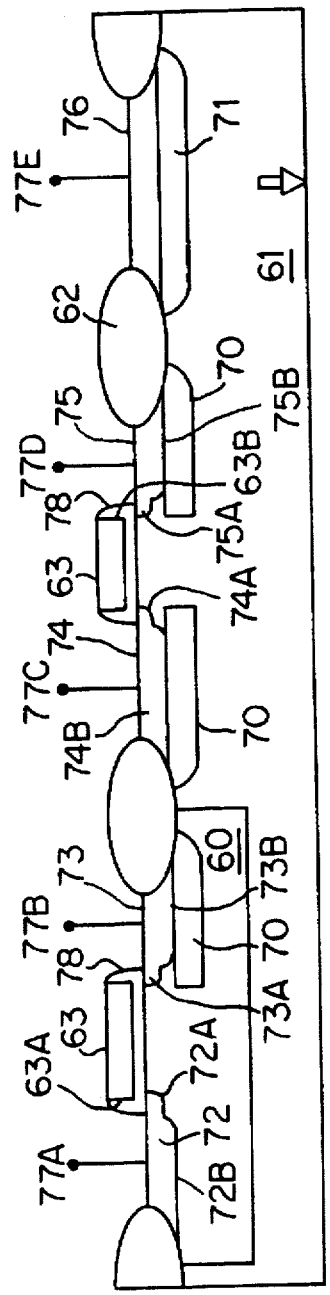

As shown in FIG. 7, after removal of gate mask 65 and resist 66, heating is conducted at a temperature and for a period of time effective to react implanted oxygen ions 68 and 69 with the substrate, typically monocrystalline silicon, to form thin, buried self-aligned oxide regions 70 and 71. Buried oxide regions 70 extend from field oxide regions 62 under regions in which drains are intended to be formed up to and substantially aligned with side surface of the gate electrode 63A in the P-channel MOS transistor and side surface of the gate electrode 63B in the N-channel CMOS transistor. As shown in FIG. 8, after formation of the buried, self-aligned oxide regions, ion implantation is conducted in a conventional manner to form source/drain regions 72, 73 of the P-channel MOS transistor, source/drain regions 74, 75 of the N-channel CMOS transistor, and N+ region 76 and the N+ resistor. In accordance with conventional practices, region 72 comprises LDD region 72A and HDD region 72B; region 73 comprises LDD region 73A and HDD region 73B; region 74 comprises LDD region 74A and HDD region 74B; and region 75 comprises LDD region 75A and HDD region 75B. Thus, the thin, self-aligned buried oxide layers 70 extend under drain regions 72 and 75 up to and substantially aligned with the side surfaces 63A and 63B, respectively, of the gate electrodes. Subsequently, contacts 77A, 77B, 77C, 77D and 77E are formed in electrical contact with P-channel MOS drain/source regions, N-channel CMOS source/drain regions and in the N+ resistor, respectively. Sidewall spacers 78 are formed and subsequent processing is performed in a conventional manner.

Figure 9:
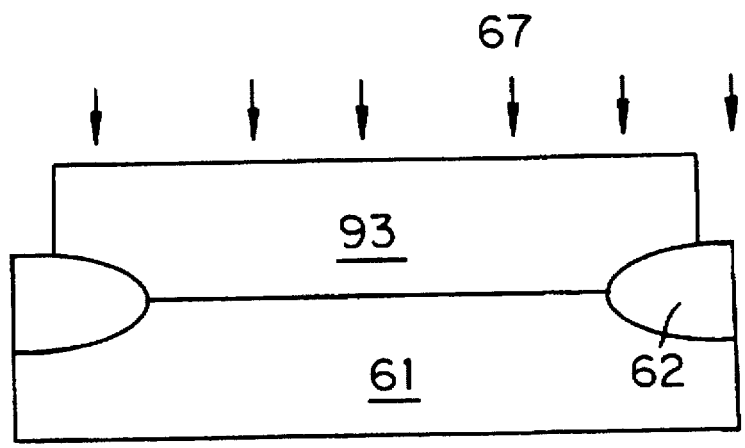
FIG. 9 schematically depicts another embodiment of the present invention.
Figure 10:
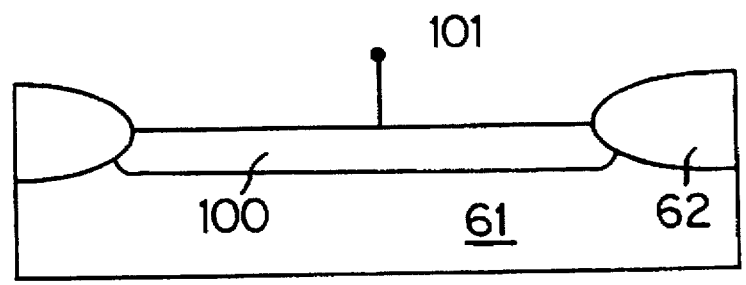
FIG. 10 schematically shows another embodiment of the present invention.

FIGS. 9 and 10 schematically illustrate an optional aspect of the present invention wherein contacts are formed without a buried oxide region, as in the FIG. 4 and FIG. 5 embodiment. Thus, as shown in FIG. 9, a resist mask 93 is applied over the substrate or N-well during oxygen ion implantation 67. After removal of resist 93, as shown in FIG. 10, impurity ion implantation is conducted to form P+ region 100 and, subsequently, contact 101 electrically connecting the substrate. In accordance with the present invention, the advantages of an SOI structure without its attendant disadvantages, such as the random threshold voltage, I–V heating causing kinks, punch-through and process complexity are eliminated by an efficient, cost-effective technique which is easily integrated into bulk CMOS processing. Thus, the advantages of both bulks CMOS and SOI isolation structures are achieved without their respective disadvantages. The resulting semiconductor device exhibits high operating speeds, greater reliability, and improved signal-to-noise ratio, linearity efficiency and wear characteristics. Hence, the semiconductor device in accordance with the present invention, produced in a simplified cost-effective manner, exhibits improved reliability.

In forming the self-aligned buried oxide layers of the present invention, one having ordinary skill in the art can easily optimize the oxygen ion implantation conditions as well as the heating conditions, such as temperature and time, to obtain the disclosed thin, buried self-aligned oxide region 5. The materials and processing techniques, such as deposition, photolithographic and etching techniques employed in the present invention are those typically employed in manufacturing conventional semiconductor device and, hence, not set forth herein in detail. The present invention is easily integrated into conventional bulk CMOS processing and involves masking implantation of oxygen ions and heating. The simplified technique enables realization of the advantages of the bulk CMOS processing as well as SOI processing without their respective disadvantages. The present invention is, therefore, applicable to any CMOS technology, particularly nonvolatile memory devices.

Only the preferred embodiment of the invention and a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device having a self-aligned insulator, which method comprises:

forming a field oxide region in a section of an upper surface of a semiconductor substrate to isolate an active region;

forming a gate electrode having side surfaces over the active region with a gate oxide therebetween and leaving portions of the active region exposed;

forming a mask on the gate electrode;

implanting oxygen ions into the exposed portions of the active region in the semiconductor substrate;

heating to effect reaction of the implanted oxygen ions to form a thin, self-aligned, buried oxide layer with an upper surface adjoining and extending from the field oxide region within the semiconductor substrate up to and substantially aligned with the gate electrode;

forming a resist mask over the gate electrode and a portion of the field oxide region prior to implanting oxygen ions;

heating after implanting oxygen ions to form a thin, self-aligned, buried oxide layer; and implanting ions to form source/drain regions therein; wherein the upper surface of the thin buried oxide layer extends either under the source or drain region.

2. A method of manufacturing a semiconductor device having a self-aligned insulator, which method comprises:

forming a field oxide region in a section of an upper surface of a semiconductor substrate to isolate an active region;

forming a gate electrode having side surfaces over the active region with a gate oxide therebetween and leaving portions of the active region exposed;

forming a mask on the gate electrode;

implanting oxygen ions into the exposed portions of the active region in the semiconductor substrate; and heating to effect reaction of the implanted oxygen ions to form a first thin, self-aligned, buried oxide layer with an upper surface extending from the field oxide region within the semiconductor substrate up to and substantially aligned with the gate electrode and a second thin buried oxide layer under the active region which does not contact the field oxide region, prior to forming the N+ region;

forming an N+ region by implanting N-type impurity ions in the surface of the semiconductor substrate adjoining the field oxide region; and forming a contact in electrical connection with the N+ region.

3. The method according to claim 1, wherein the thin buried oxide layer has a thickness of about 10 to about 1000 Å.

4. A method of manufacturing a semiconductor device having a self-aligned insulator, which method comprises:

forming a field oxide region in a section of an upper surface of a semiconductor substrate to isolate an active region;

forming a gate electrode having side surfaces over the active region with a gate oxide therebetween;

forming a mask on the gate electrode to leave portions of the active region exposed;

implanting oxygen ions into the exposed portions of the active region in the semiconductor substrate; and heating to effect reaction of the implanted oxygen ions to form a thin, self-aligned buried oxide layer with an upper surface extending from a point proximate and spaced apart from the field oxide regions within the semiconductor substrate up to and substantially aligned with the gate electrode.

5. The method according to claim 4 wherein the thin buried oxide layer extends from a point spaced apart from the field oxide region by a distance less than about one micron.

6. A method of manufacturing a semiconductor device having a self-aligned insulator, which method comprises:

forming a field oxide region in a section of an upper surface of a semiconductor substrate to isolate an active region;

forming a gate electrode having side surfaces over the active region with a gate oxide therebetween;

forming a mask on the gate electrode to leave portions of the active region exposed;

implanting oxygen ions into the exposed portions of the active region in the semiconductor substrate; and heating to effect reaction of the implanted oxygen ions to form a thin, self-aligned, buried oxide layer with an upper surface extending from a point proximate and spaced apart from the field oxide regions within the semiconductor substrate partially underlying the gate electrode.

7. The method according to claim 6, wherein the thin buried oxide layer extends from a point spaced apart from the field oxide region by a distance less than about one micron.

8. The method according to claim 4, further comprising implanting impurities to form a source/drain region above the buried oxide layer and spaced apart from the field oxide region.

* * * * *